US010192897B2

(12) United States Patent
Lin et al.

(10) Patent No.: US 10,192,897 B2
(45) Date of Patent: Jan. 29, 2019

(54) ARRAY SUBSTRATE AND DISPLAY DEVICE AND METHOD FOR MAKING THE ARRAY SUBSTRATE

(71) Applicant: HON HAI PRECISION INDUSTRY CO., LTD., New Taipei (TW)

(72) Inventors: Hsin-Hua Lin, New Taipei (TW); Yi-Chun Kao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/252,883

(22) Filed: Aug. 31, 2016

(65) Prior Publication Data
US 2017/0084642 A1 Mar. 23, 2017

Related U.S. Application Data

(60) Provisional application No. 62/220,259, filed on Sep. 18, 2015, provisional application No. 62/220,258, filed on Sep. 18, 2015, provisional application No. 62/220,257, filed on Sep. 18, 2015, provisional application No. 62/220,261, filed on Sep. 18, 2015.

(51) Int. Cl.
| | |
|---|---|
| *H01L 27/12* | (2006.01) |
| *H01L 21/265* | (2006.01) |
| *H01L 29/417* | (2006.01) |
| H01L 29/786 | (2006.01) |
| H01L 29/49 | (2006.01) |
| H01L 27/32 | (2006.01) |

(52) U.S. Cl.
CPC .... *H01L 27/1251* (2013.01); *H01L 21/26513* (2013.01); *H01L 27/127* (2013.01); *H01L 27/1225* (2013.01); *H01L 27/1233* (2013.01); *H01L 27/1237* (2013.01); *H01L 27/1259* (2013.01); *H01L 27/1288* (2013.01); *H01L 29/41733* (2013.01); H01L 27/3262 (2013.01); H01L 29/4908 (2013.01); H01L 29/7869 (2013.01); H01L 29/78621 (2013.01); H01L 29/78675 (2013.01); H01L 29/78678 (2013.01); H01L 29/78696 (2013.01)

(58) Field of Classification Search
None
See application file for complete search history.

(56) References Cited

U.S. PATENT DOCUMENTS 9,437,750 B1 * 9/2016 Fang ................. H01L 29/78696
9,704,939 B2 * 7/2017 Chang ................ H01L 27/3276
(Continued)

*Primary Examiner* — Abul Kalam
(74) *Attorney, Agent, or Firm* — ScienBiziP, P.C.

(57) ABSTRACT

An array substrate includes a substrate, a first TFT, a second TFT, and a third TFT. The first TFT includes a first channel layer on the substrate, a first gate insulator layer, a first gate electrode, a first dielectric layer, and a second dielectric layer. The second TFT includes a first semiconductor layer on the substrate, a second gate insulator layer, a second gate electrode, a third dielectric layer, and a second channel layer. The first channel layer is made of a semiconducting material containing polycrystalline silicon. The second channel layer is made of a semiconducting material containing metal oxide. The first dielectric layer is made of silicon nitride; the second dielectric layer and the third dielectric layer are made of silicon oxide.

13 Claims, 10 Drawing Sheets

(56) References Cited

U.S. PATENT DOCUMENTS

| | | | |
|---|---|---|---|
| 2014/0175426 A1* | 6/2014 | Tsang | H01L 29/7869 |
| | | | 257/43 |
| 2014/0175427 A1* | 6/2014 | Tsang | H01L 29/7869 |
| | | | 257/43 |
| 2015/0055051 A1 | 2/2015 | Osawa et al. | |
| 2015/0279862 A1* | 10/2015 | Chuang | H01L 27/1218 |
| | | | 257/40 |
| 2017/0084636 A1* | 3/2017 | Lin | H01L 27/1251 |
| 2017/0084639 A1* | 3/2017 | Kao | H01L 27/1251 |
| 2017/0084641 A1* | 3/2017 | Lin | H01L 27/1251 |

* cited by examiner

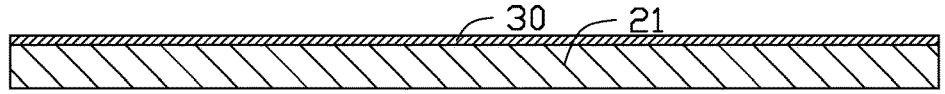
FIG. 5
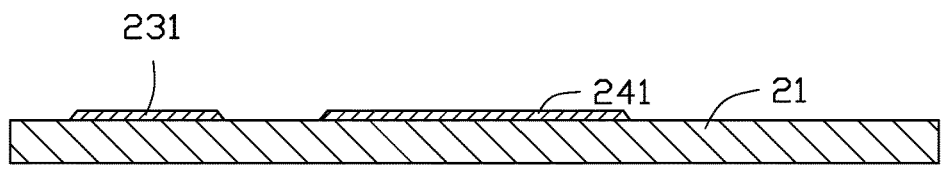
FIG. 6A
FIG. 6B
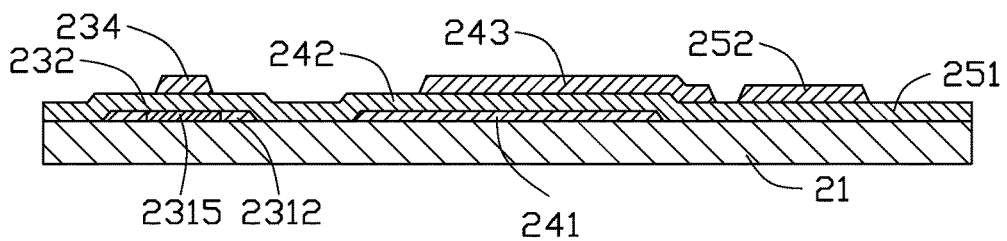
FIG. 7
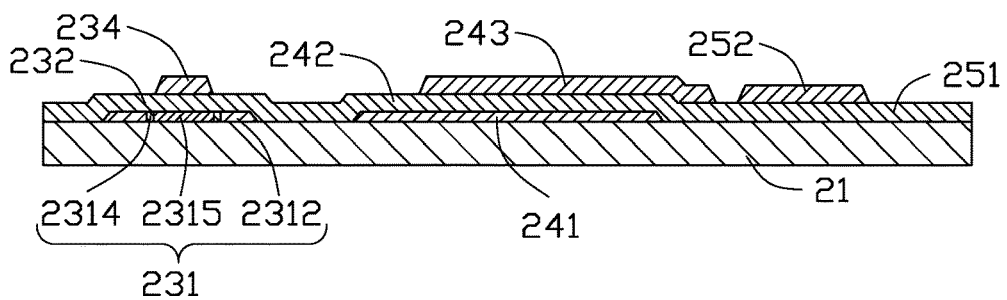
FIG. 8

ARRAY SUBSTRATE AND DISPLAY DEVICE AND METHOD FOR MAKING THE ARRAY SUBSTRATE

CROSS-REFERENCE TO RELATED APPLICATIONS

This application claims priority from U.S. provisional application Ser. Nos. 62/220,257, 62/220,258, 62/220,259, and 62/220,261 filed on Sep. 18, 2015 which are incorporated herein by reference.

FIELD

The subject matter herein generally relates to an array substrate, a display device having the array substrate, and method for making the array substrate, more particularly to an array substrate for an organic light emitting diode (OLED) display device.

BACKGROUND

Two common kinds of display devices are a liquid crystal display (LCD) device and an OLED display device. The OLED display device usually includes a substrate, a pixel array, and a driving circuit formed on the substrate. The OLED fabrication process is prone to damage from the high temperature fabrication process which results in degradation in display performance and quality. There is room for improvement in the display, operation, and luminance of an OLED device.

BRIEF DESCRIPTION OF THE DRAWINGS

Implementations of the present technology will now be described, by way of example only, with reference to the attached figures.

FIG. 5 through FIG. 16 illustrate steps for manufacturing the array substrate of FIG. 1 according to blocks of FIG. 3 and FIG. 4.

DETAILED DESCRIPTION

Figure 1:
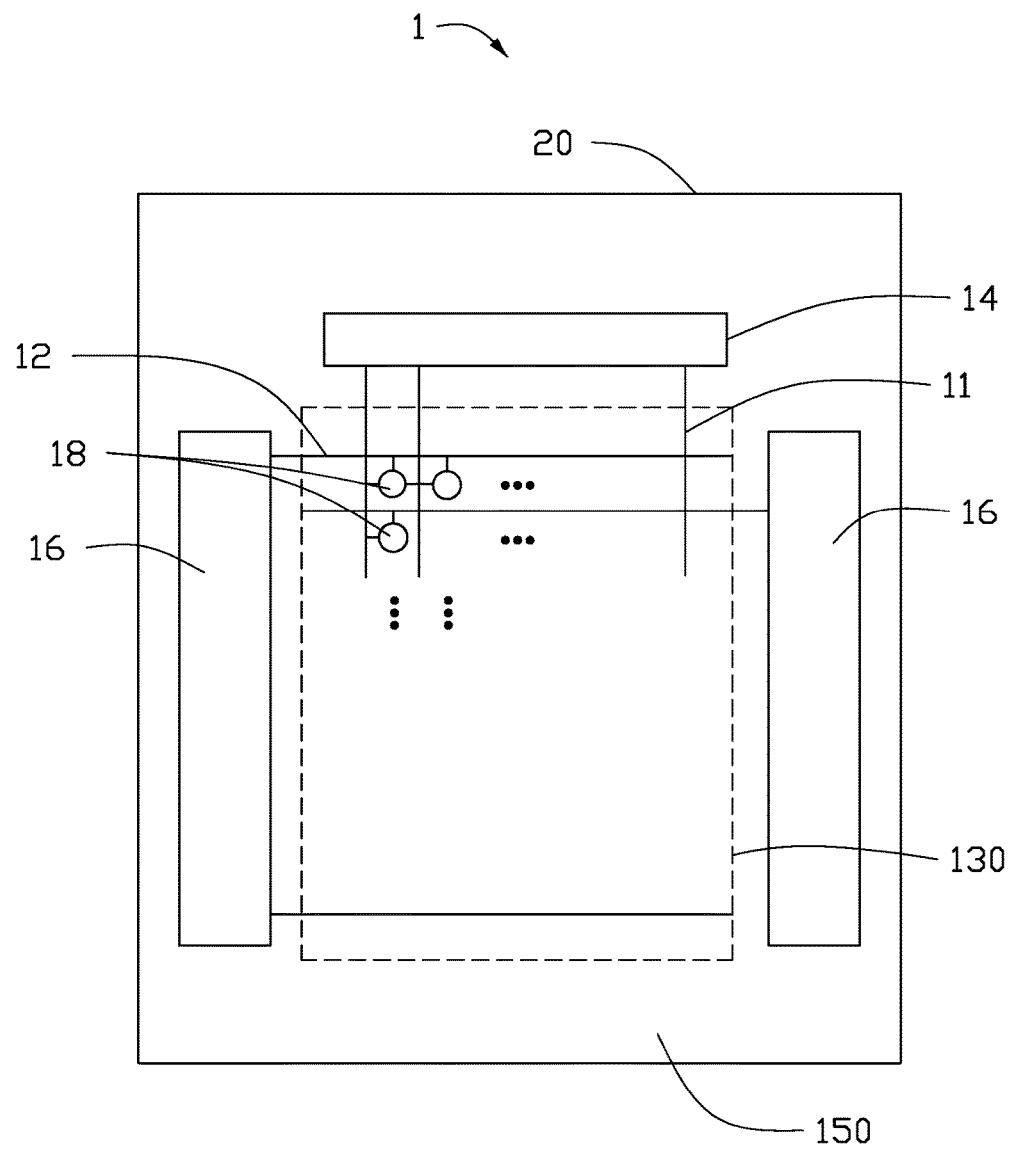
FIG. 1 is a plan view of an array substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a display device 1. The display device 1 can be an OLED display device, an LCD display device, or any other type display device.

The display device 1 includes an array substrate 20. The array substrate 20 includes a plurality of data lines 11 parallel to each other, a plurality of scan lines 12 parallel to each other, at least one first driving circuit 14, and at least one second driving circuit 16. The plurality of data lines 11 is electrically coupled to the first driving circuit 14. The plurality of scan lines 12 is electrically coupled to the second driving circuit 16. The data lines 11 are perpendicular to the scan lines 12 and electrically isolated from the scan lines 12. The scan lines 12 intersect with the data lines 11. A pixel unit 18 is formed at an intersection area defined by every two adjacent scan lines 12 and every two adjacent data lines 11. The array substrate 20 defines a display area 130 and a peripheral area 150 around the display area 130. The scan lines 12, the data lines 11, and the pixel units 18 are positioned in the display area 130. The first driving circuit 14 and the second driving circuit 16 are positioned in the peripheral area 150. The first driving circuit 14 and the second driving circuit 16 may be positioned adjacent to sides of the array substrate 20. In this embodiment, the array substrate 20 includes one first driving circuit 14 positioned adjacent to a top side of the array substrate 20 and two second driving circuits 16 positioned adjacent to a left side and a right side of the array substrate 20.

Figure 2:
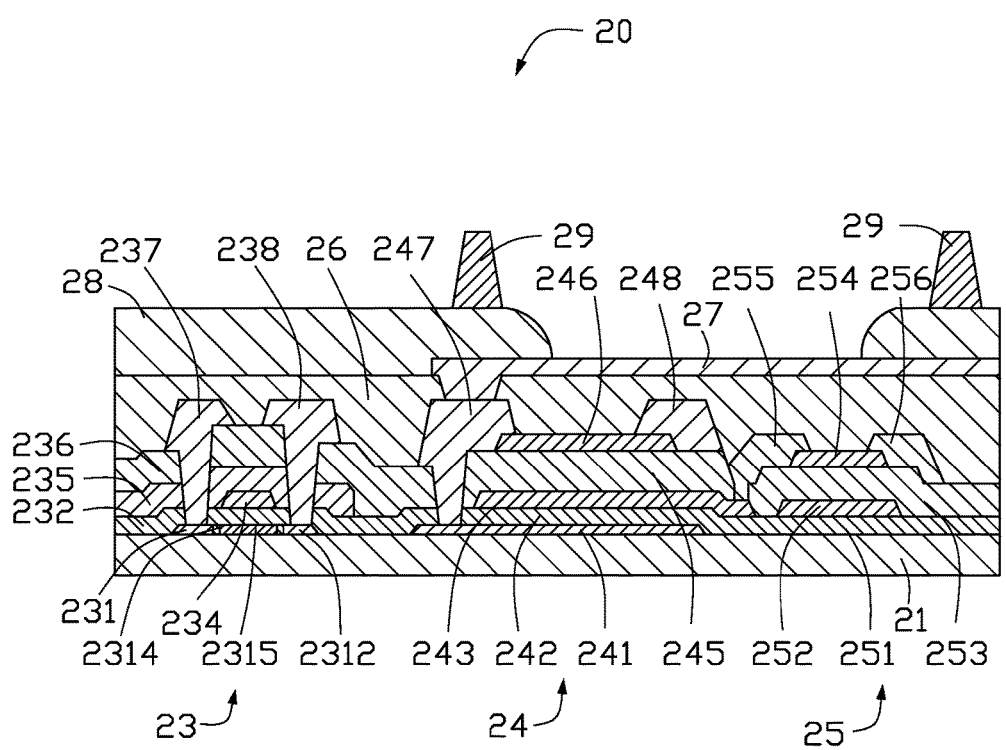
FIG. 2 is a cross-sectional view of a first exemplary embodiment of the array substrate of FIG. 1.
Figure 3:
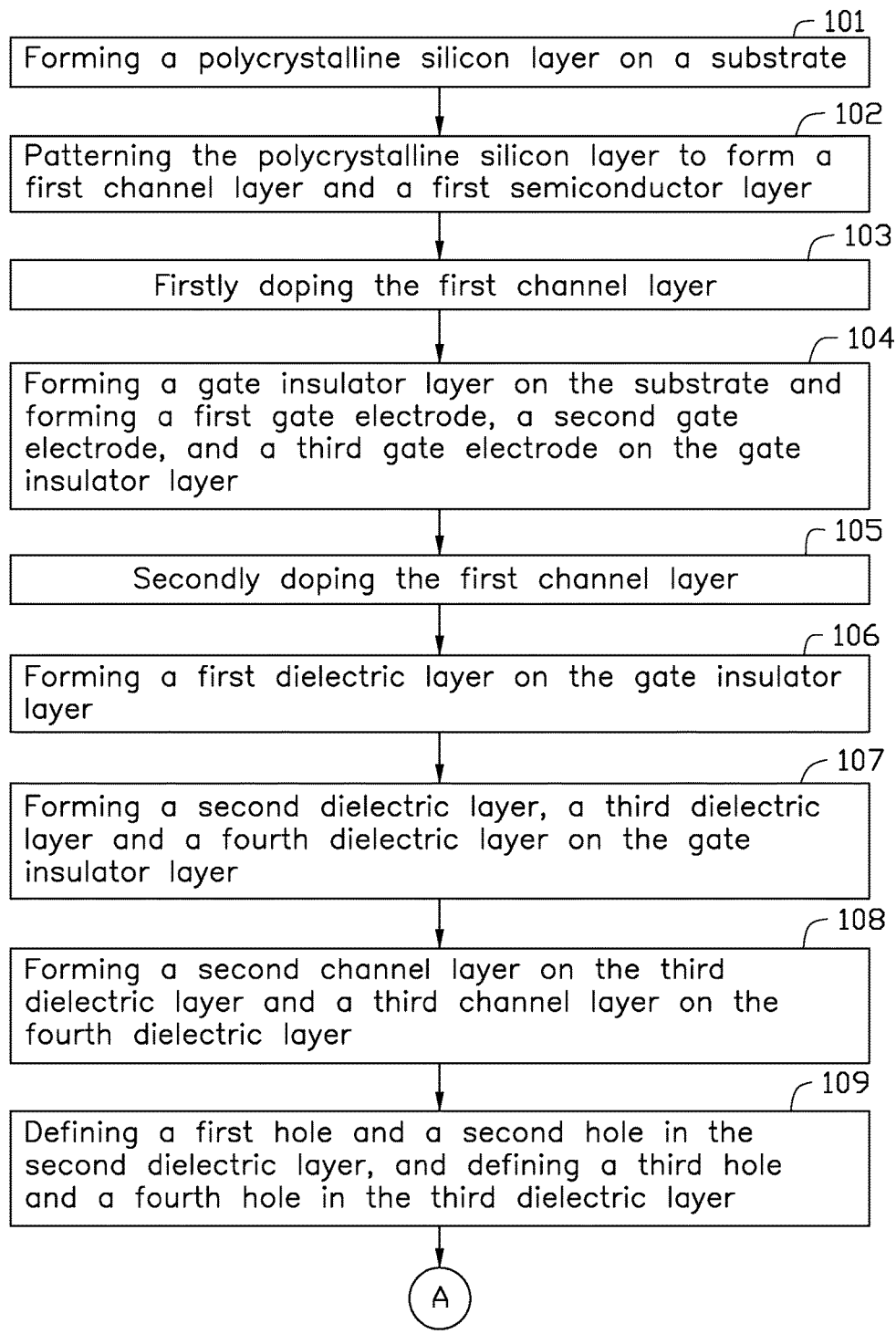
FIG. 3 through FIG. 4 illustrate a flow chart of a method for making the array substrate of FIG. 1.

FIG. 2 illustrates a cross-sectional view of part of the array substrate 20. The array substrate 20 further includes a substrate 21, which supports a plurality of first TFTs 23, a plurality of second TFTs 24, and a plurality of third TFTs 25. FIG. 3 only shows one first TFT 23, one second TFT 24, and one third TFT 25.

In this embodiment, the first TFTs 23 are positioned in the peripheral area 150, and the second TFTs 24 and the third TFTs 25 are positioned in the display area 130. In another embodiment, the first TFTs 23 are not limited to being positioned in the peripheral area 150 and can be positioned in the display area 130. The second TFTs 24 and the third TFTs 25 are not limited to being positioned in the display area 130 and can be positioned in the peripheral area 150.

Each of the first TFTs 23, the second TFTs 24, and the third TFTs 25 has a channel layer. The channel layer defines a semiconductive/active region of a TFT device through which charge carriers may pass. The channel layer may comprise a suitable semiconducting material, which may include an oxide semiconductor, elemental semiconductor, compound semiconductor, and an alloy semiconducting material. The structure of the semiconductive material may be amorphous, crystalline, or poly-crystalline structure, or a combination of such structures. In some embodiments, the channel layer comprises one or more oxide-type compound semiconducting material, such as indium-gallium-zinc oxide (IGZO), indium-zinc-tin oxide (IZTO), indium-gallium-tin oxide (IGTO), and indium-aluminum-zinc oxide (IAZO) material. In some embodiments, the channel layer substantially comprises hydrogenated amorphous silicon (a-Si:H). The amorphous silicon channel material, which offers high charge carrier mobility (e.g., about 0.1-1 cm$^2$ v$^{-1}$ s$^{-1}$) and high thin film uniformity, may be implemented for large scale fabrication. In some embodiments, the channel layer comprises polycrystalline silicon material prepared in a low temperature process (e.g., low temperature polycrystalline silicone (LTPS)). The LTPS channel material offers superior charge carrier mobility (e.g., about 100-200 cm$^2$ v$^{-1}$ s$^{-1}$), but requires higher fabrication cost, particularly in the application of large size display panel devices.

In this embodiment, the first TFTs 23 are a type of TFT having a channel layer made of a semiconducting material containing polycrystalline silicon, referred to as the "polycrystalline silicon TFT". The second TFTs 24 and the third TFTs 25 are a type of TFT having a channel layer made of a semiconducting material containing metal oxide, referred to as the "metal oxide TFT".

The first TFTs 23 can be used in the first driving circuit 14 and/or the second driving circuit 16. Each first TFT 23 includes a first channel layer 231, a first gate insulator layer 232, a first gate electrode 234, a first dielectric layer 235, a second dielectric layer 236, a first source electrode 237, and a first drain electrode 238.

The first channel layer 231 is directly formed on the substrate 21. In this embodiment, the first channel layer 231 is made of a semiconducting material containing polycrystalline silicon doped with P-type ions or N-type ions. The P-type ion is a kind of ion having a valence of positive three, such as boron ion. The N-type ion is a kind of ion having a valence of positive five, such as phosphate ion. The first channel layer 231 includes a non-doped portion 2315, two first doped portions 2312, and two second doped portions 2314. The non-doped portion 2315 is made of polycrystalline silicon without doped ions and is located in the center of the first channel layer 231, the two second doped portions 2314 are located at opposite sides of the non-doped portion 2315. Each first doped portion 2312 is located at a side of one of the two second doped portions 2314 away from the non-doped portion 2315. That is, each second doped portion 2314 is positioned between the non-doped portion 2315 and one of the first doped portions 2312. Both the first doped portions 2312 and the second doped portions 2314 are made of polycrystalline silicon doped with P-type ion or N-type ions. Each first doped portion 2312 has a doping concentration higher than that of each second doped portion 2314.

The first gate insulator layer 232 is formed on the substrate 21 and covers the first channel layer 231. The first gate electrode 234 is formed on the first gate insulator layer 232. The first gate electrode 234 corresponds to the first channel layer 231, and particularly corresponds to the non-doped portion 2315. The first dielectric layer 235 is formed on the first gate insulator layer 232 and covers the first gate electrode 234. The second dielectric layer 236 is formed on the first dielectric layer 235 and covers the first dielectric layer 235. Both the first source electrode 237 and the first drain electrode 238 are formed on the second dielectric layer 236. The first source electrode 237 and the first drain electrode 238 extend to pass through the second dielectric layer 236, the first dielectric layer 235, and the first gate insulator layer 232 to electrically couple to the first channel layer 231.

Each second TFT 24 is electrically coupled to the data line 11 and scan line 12. Each second TFT 24 is configured to drive an anode, e.g., the electrode layer 27, of a light emitting diode (not shown). A light emitting diode generally includes an anode, a cathode, and light-emitting material between the anode and the cathode. Each second TFT 24 includes a second gate insulator layer 242, a second gate electrode 243, a third dielectric layer 245, a second channel layer 246, a second source electrode 247, and a second drain electrode 248. A first semiconductor layer 241 is formed under the second TFT 24.

The first semiconductor layer 241 is directly formed on the substrate 21. The second gate insulator layer 242 is formed on the substrate 21 and covers the first semiconductor layer 241. The second gate electrode 243 is formed on the second gate insulator layer 242 and corresponds to the first semiconductor layer 241. The third dielectric layer 245 is formed on the second gate insulator layer 242 and covers the second gate electrode 243. The second channel layer 246 is formed on the third dielectric layer 245 and corresponds to the second gate electrode 243. Both the second source electrode 247 and the second drain electrode 248 are formed on the third dielectric layer 245 and partially cover the second channel layer 246 to electrically couple to the second channel layer 246.

The second source electrode 247 extends to pass through the third dielectric layer 245 and the second gate insulator layer 242 to electrically couple to the first semiconductor layer 241.

The first semiconductor layer 241, the second gate electrode 243, and the second gate insulator layer 242, positioned between the first semiconductor layer 241 and the second gate electrode 243, together define a storage capacitor (not shown) for the pixel unit 18.

Each third TFT 25 is configured to drive a pixel unit 18. Each third TFT 25 includes a third gate insulator layer 251, a third gate electrode 252, a fourth dielectric layer 253, a third channel layer 254, a third source electrode 255, and a third drain electrode 256.

The third gate insulator layer 251 is directly formed on the substrate 21. The third gate electrode 252 is formed on the third gate insulator layer 251. The fourth dielectric layer 253 is formed on the third gate insulator layer 251 and covers the third gate electrode 252. The third channel layer 254 is formed on the fourth dielectric layer 253 and corresponds to the third gate electrode 252. Both the third source electrode 255 and the third drain electrode 256 are formed on the fourth dielectric layer 253 and partially cover the third channel layer 254 to electrically couple to the third channel layer 254. The third drain electrode 256 also extends to pass through the fourth dielectric layer 253 to electrically couple to the second gate electrode 243.

The first gate insulator layer 232, the second gate insulator layer 242, the third gate insulator layer 251, the first dielectric layer 235, the second dielectric layer 236, the third dielectric layer 245, and the fourth dielectric layer 253 may comprise a suitable dielectric material, such as silicon oxide (SiOx), silicon nitride (SiNx), silicon oxynitride (SiOxNy), aluminum oxide (AlOx), yttrium oxide (Y2O3), hafnium oxide (HfOx), zirconium oxide (ZrOx), aluminum nitride (AlN), aluminum oxynitride (AlNO), titanium oxide (TiOx), barium titanate (BaTiO3), or lead titanate (PbTiO3). In some embodiments, one or more high-K dielectric materials may be used as the first gate insulator layer 232, the second gate insulator layer 242, the third gate insulator layer 251, the first dielectric layer 235, the second dielectric layer 236, the third dielectric layer 245, and the fourth dielectric layer 253. Possible high-K dielectric materials may include, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

In this embodiment, the first dielectric layer 235 is made of SiNx. The second dielectric layer 236, the third dielectric layer 245, and the fourth dielectric layer 253 are made of SiOx. In this embodiment, the second channel layer 246 and the third channel layer 254 are made of IGZO.

The substrate 21 typically comprises an insulating material. Suitable materials for the substrate 21 may include glass, quartz, plastic, and other materials having sufficient optical transparency (e.g., for electromagnetic radiations in the visible spectrum for visual display applications). In some embodiments, the substrate 21 may comprise ceramic and/or silicon materials. In some applications, flexible substrate materials may be adopted. Suitable materials for the flexible substrate may include, for example, polyethersulfone (PES), polyethylene naphthalate (PEN), polyethylene (PE), polyimide (PI), polyvinyl chloride (PVC), polyethylene terephthalate (PET), and stainless steel, or combinations thereof.

The array substrate 20 further includes a planar layer 26, an electrode layer 27, a light emitting defining layer 28, and at least two spacers 29. The planar layer 26 covers the plurality of first TFTs 23, the plurality of second TFTs 24, and the plurality of third TFTs 25. The electrode layer 27 acts as an anode for a light emitting diode (not shown). The electrode layer 27 is formed on the planar layer 26 and passes through the planar layer 26 to electrically couple to the second drain electrode 247. The light emitting defining layer 28 is formed on the planar layer 26 and partially covers the electrode layer 27. The light emitting defining layer 28 is configured to define a light emitting region for the pixel units 18. The at least two spacers 29 are spaced apart from each other and positioned on the light emitting defining layer 28. Each spacer 29 has a cross section shaped like a trapezoid.

In some embodiments, the array substrate 20 may further include a buffer layer (not shown) formed on the substrate 21. The first channel layer 231, the first semiconductor layer 241, the first gate insulator layer 232, the second gate insulator layer 242, and the third gate insulator layer 251 can all be formed on such a buffer layer.

The first gate insulator layer 232, the second gate insulator layer 242, and the third gate insulator layer 251 are formed by a single layer and by a single process. The second dielectric layer 236, the third dielectric layer 245, and the fourth dielectric layer 253 are formed by a single layer and by a single process.

The array substrate 20 is a hybrid TFT array substrate, and includes low-temperature polycrystalline silicon TFTs (e. g., the first TFTs 23) and metal oxide TFTs (e. g., the second TFTs 24 and the third TFTs 25) formed on the substrate 21. The first TFTs 23 have high electron mobility and can improve a reaction rate of the driving circuit 14. The first TFTs 23 have a small volume, allowing a narrowing of the non-display region. The second TFTs 24 and the third TFTs 25 have a low leakage current.

Figure 4:
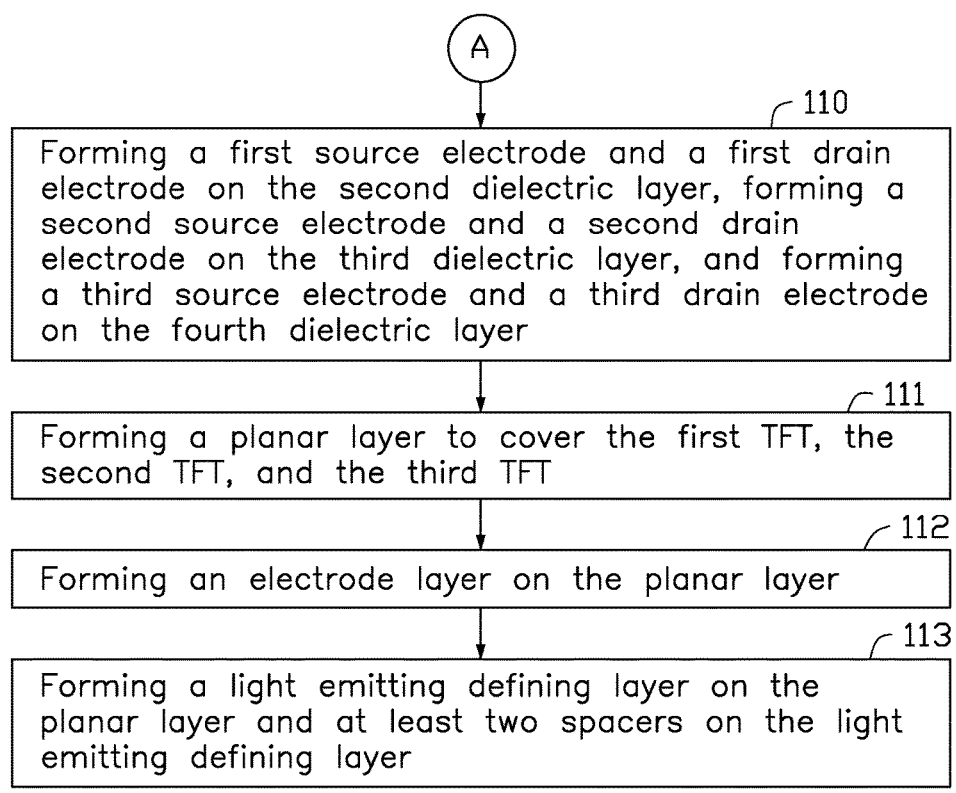

FIG. 3 to FIG. 4 illustrate a flow chart of an exemplary method for making the array substrate 20 shown in FIG. 2. The method is provided by way of example, as there are a variety of ways for carrying out the method. Each block shown in FIG. 3 and FIG. 4 represents one or more processes, methods, or subroutines, carried out in the exemplary method. The exemplary method can begin at block 101.

At block 101, a polycrystalline silicon layer 30 is formed on a substrate 21, as shown FIG. 5. The polycrystalline silicon layer 30 entirely covers a surface of the substrate 21 and has a thickness less than the thickness of the substrate 21.

The substrate 21 typically comprises an insulating material. Suitable materials for the substrate 21 may include glass, quartz, and plastic having sufficient optical transparency (e.g., for electromagnetic radiations in the visible spectrum for visual display applications). In some embodiments, the substrate 21 may comprise ceramic and/or silicon materials. In some applications, flexible substrate materials may be adopted. Suitable choice of material for the flexible substrate may include, for example, PES, PEN, PE, PI, PVC, and PET, or combinations thereof.

At block 102, as shown in FIG. 6A, the polycrystalline silicon layer 30 is patterned to form a first channel layer 231 and a first semiconductor layer 241. The first channel layer 231 and the first semiconductor layer 241 are spaced apart from each other.

At block 103, as shown in FIG. 6B, two side portions of the first channel layer 231 are doped with P-type ions or N-type ions to form two first doped portions 2312 by using a first mask. The first mask is used to expose the two side portions of the first channel layer 231 and shield other portions of the first channel layer 231. The P-type ion is a kind of ion having a valence of positive three, such as boron ion. The N-type ion is a kind of ion having a valence of positive five, such as phosphate ion. In this embodiment, the first channel layer 231 is doped with boron ions. In other embodiment, the polycrystalline silicon layer 30 is doped with N-type ions having a valence of positive five, such as phosphate ion.

At block 104, as shown in FIG. 7, a first gate insulator layer 232, a second gate insulator layer 242, and a third gate insulator layer 251 are formed on the substrate 21. Then a first gate electrode 234 is formed on the first gate insulator layer 232, a second gate electrode 243 is formed on the second gate insulator layer 242, and a third gate electrode 252 is formed on the third gate insulator layer 251. The first gate insulator layer 232 covers the first channel layer 231, and the second gate insulator layer 242 covers the first semiconductor layer 241.

The first gate insulator layer 232, the second gate insulator layer 242, and the third gate insulator layer 251 are formed by a single layer and are formed by a single process. The process of forming the first gate insulator layer 232, the second gate insulator layer 242, and the third gate insulator layer 251 may comprise depositing an insulator layer on the substrate 21. The process of forming the first gate electrode 234, the second gate electrode 243, and the third gate electrode 252 may comprise depositing a first conductive material layer and patterning the first conductive material layer to form the first gate electrode 234, the second gate electrode 243, and the third gate electrode 252.

The first gate electrode 234 corresponds to the first channel layer 231, and the second gate electrode 243 corresponds to the first semiconductor layer 241. The first gate electrode 234 has a width less than the width of the first channel layer 231, that is, the first channel layer 231 extends beyond the first gate electrode 234.

At block 105, as shown in FIG. 8, the first channel layer 231 is doped with P-type ions or N-type ions by using a second mask. In this embodiment, the first channel layer 231 is doped with boron ions. In other embodiment, the polycrystalline silicon layer 30 is doped with N-type ions having a valence of positive five, such as phosphate ion. The second mask is used to expose two opposite portions of the first channel layer 231 that extend beyond the first gate electrode 234 and shield other portions of the first channel layer 231. As such, the first channel layer 231 finally includes a non-doped portion 2315, two first doped portions 2312, and two second doped portions 2314. The non-doped portion 2315 is made of polycrystalline silicon without doped ions and the non-doped portion is located in the center of the first channel layer 231, the two second doped portions 2314 are located at opposite sides of the non-doped portion 2315. Each first doped portion 2312 is located at a side of one second doped portion 2314 away from the non-doped portion 2315. Each first doped portion 2312 has doped ion concentration higher than that of each second doped portion 2314.

Figure 9A:
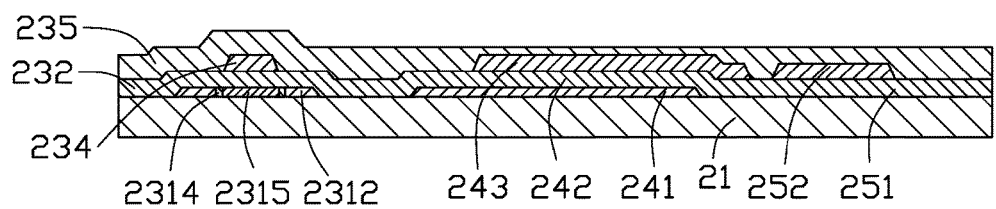
Figure 9B:
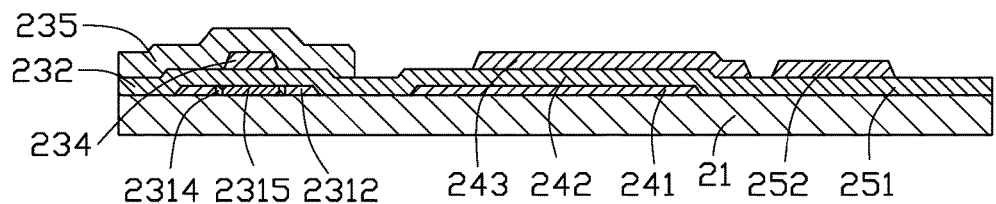

At block 106, a first dielectric layer 235 is formed on the first gate insulator layer 232. The process of forming the first dielectric layer 235 may comprise depositing a first dielectric material layer on the first gate insulator layer 232, the second gate insulator layer 242, and the third gate insulator layer 251 (as shown in FIG. 9A), and removing a portion of the first dielectric layer 235 covering the second gate insulator layer 242, and the third gate insulator layer 251 (as shown in FIG. 9A). The first dielectric layer 235 covers the first gate electrode 234. In this embodiment, the first dielectric layer 235 is made of silicon nitride.

Figure 10:
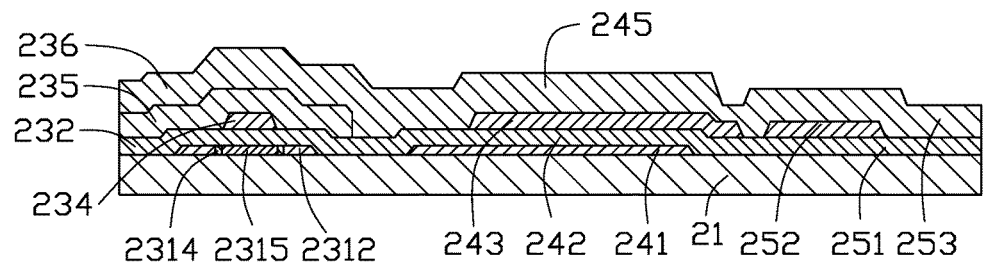

At block 107, as shown in FIG. 10, a second dielectric layer 236 is formed on the first dielectric layer 235, a third dielectric layer 245 is formed on the second gate insulator layer 242, and a fourth dielectric layer 253 is formed the third gate insulator layer 251. The third dielectric layer 245 covers the second gate electrode 243, and the fourth dielectric layer 253 covers the third gate electrode 252. The second dielectric layer 236, the third dielectric layer 245, and the fourth dielectric layer 253 are formed by a single layer and are formed by a single process. The process of forming the second dielectric layer 236, the third dielectric layer 245, and the fourth dielectric layer 253 may comprise depositing a dielectric material layer on the first dielectric layer 235, the second gate insulator layer 242, and the third gate insulator layer 251. In this embodiment, the second dielectric layer 236, the third dielectric layer 245, and the fourth dielectric layer 253 are made of silicon oxide.

Figure 11:
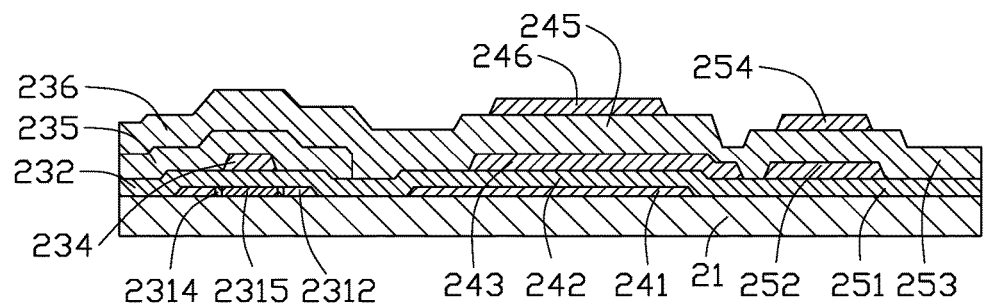

At block 108, as shown in FIG. 11, a second channel layer 246 is formed on the third dielectric layer 245, a third channel layer 254 is formed on the fourth dielectric layer 253. The second channel layer 246 corresponds to the second gate electrode 243, and the third channel layer 254 corresponds to the third gate electrode 252. The process of forming the second channel layer 246 and third channel layer 254 may comprise depositing a semiconducting material layer on the third dielectric layer 245 and the fourth dielectric layer, and then patterning the semiconducting material layer to form the second channel layer 246 and third channel layer 254. In this embodiment, the semiconducting material layer is made of IGZO.

Figure 12:
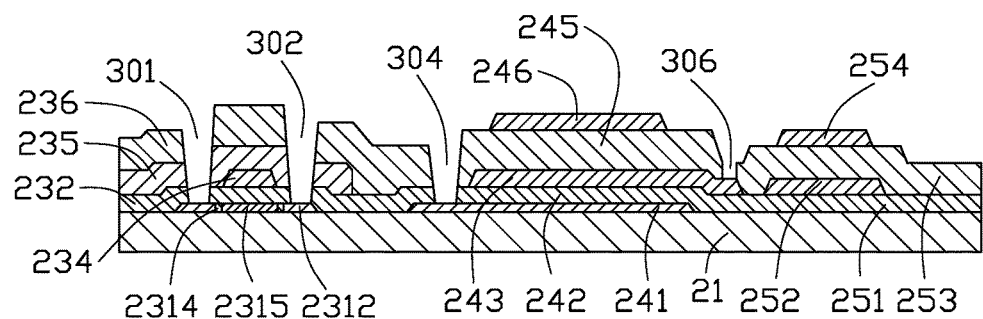

At block 109, as shown in FIG. 12, a first hole 301 and a second hole 302 are defined in the second dielectric layer 236, a third hole 304 and a fourth hole 306 are defined in the third dielectric layer 245. The first hole 301 and the second hole 302 pass through the second dielectric layer 236, the first dielectric layer 235, and the first gate insulator layer 231 to expose the first channel layer 231. The first hole 301 and the second hole 302 correspond to the first channel layer 231, and in particular, to the two first doped portions 2312. The third hole 304 corresponds to the first semiconductor layer 241 and passes through the third dielectric layer 245 and the second gate insulator layer 242 to expose the first semiconductor layer 241. The fourth hole 306 corresponds to the second gate electrode 243 and passes through the third dielectric layer 245 to expose the second gate electrode 243.

Figure 13:
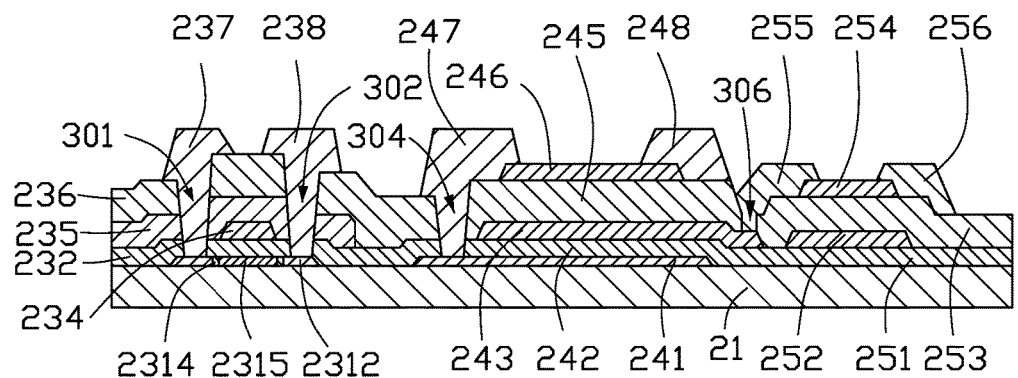

At block 110, as shown in FIG. 13, a first source electrode 237 and a first drain electrode 238 are formed on the second dielectric layer 236, a second source electrode 247 and a second drain electrode 248 are formed on the third dielectric layer 245, and a third source electrode 255 and a third drain electrode 256 are formed on the fourth dielectric layer 253. The first source electrode 237 extends into the first hole 301 to electrically couple to one of the first doped portions 2312. The first drain electrode 238 extends into the second hole 302 to electrically couple to another one of the first doped portions 2312. The second source electrode 247 extends into the third hole 304 to electrically couple to the first semiconductor layer 241. The third source electrode 255 extends into the fourth hole 306 to electrically couple to the second gate electrode 243.

The process of forming the first source electrode 237, the first drain electrode 238, the second source electrode 247, the second drain electrode 248, the third source electrode 255, and the third drain electrode 256 may comprise depositing a second conductive material layer and patterning the second conductive material layer to form the first source electrode 237, the first drain electrode 238, the second source electrode 247, the second drain electrode 248, the third source electrode 255, and the third drain electrode 256.

Finally, the first channel layer 231, the first gate insulator layer 232, the first gate electrode 234, the first dielectric layer 235, the second dielectric layer 236, the first source electrode 237, and the first drain electrode 238 together define the first TFT 23. The first semiconductor layer 241, the second gate insulator layer 242, the second gate electrode 243, the third dielectric layer 245, the second channel layer 246, the second source electrode 247, and the second drain electrode 248 together define the second TFT 24. The third gate insulator layer 251, the third gate electrode 252, the fourth dielectric layer 253, the third channel layer 254, the third source electrode 255, and the third drain electrode 256 together define the third TFT 25.

Figure 14:
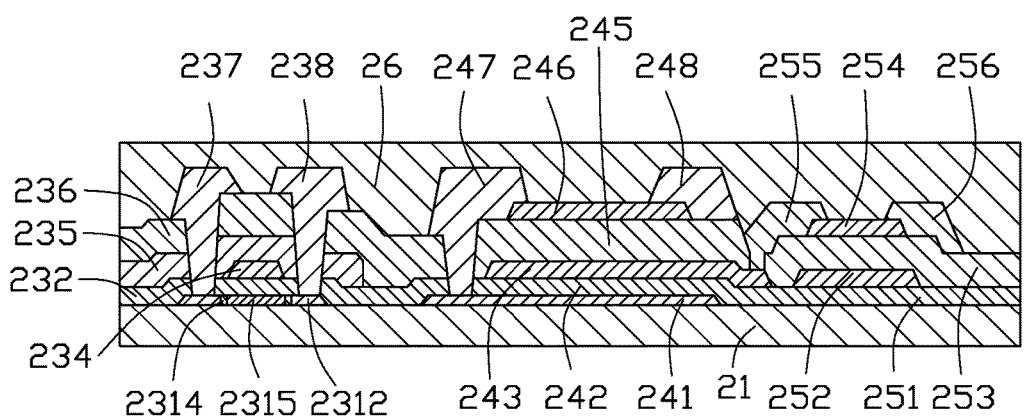

At block 111, as shown in FIG. 14, a planar layer 26 is formed to cover the first TFT 23, the second TFT 24, and the third TFT 25.

Figure 15A:
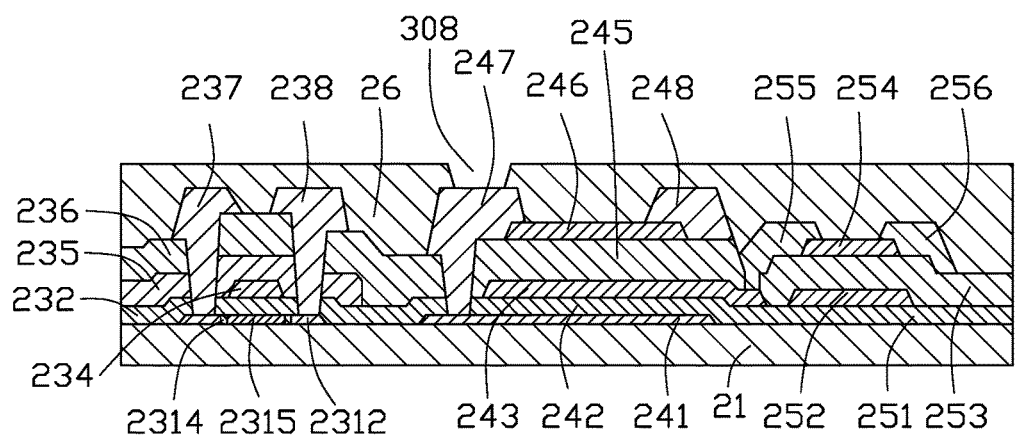
Figure 15B:
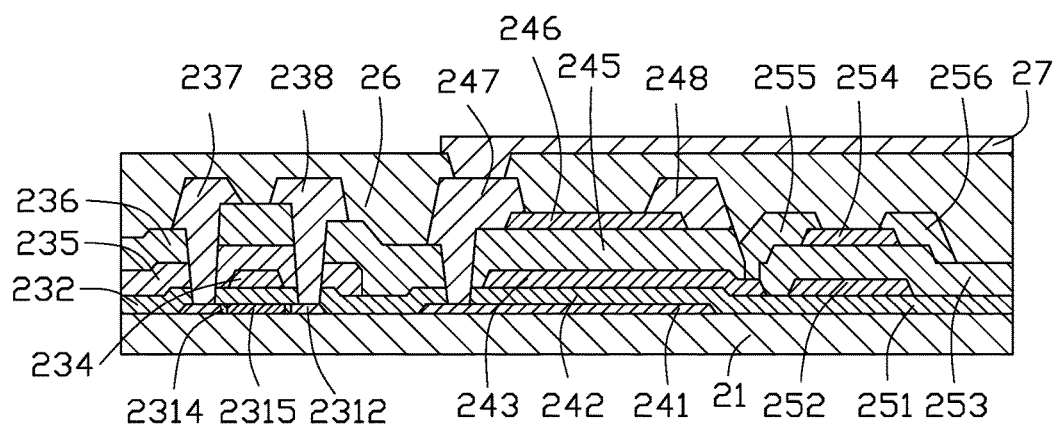

At block 112, as shown in FIG. 15A, a fifth hole 308 corresponding to the second source electrode 247 is defined in the planar layer 26 (as shown in FIG. 15B). An electrode layer 27 is formed on the planar layer 26 and extends into the fifth hole 308 to electrically couple to the second source electrode 247. The electrode layer 27 is the anode of a light emitting diode (not shown).

Figure 16:
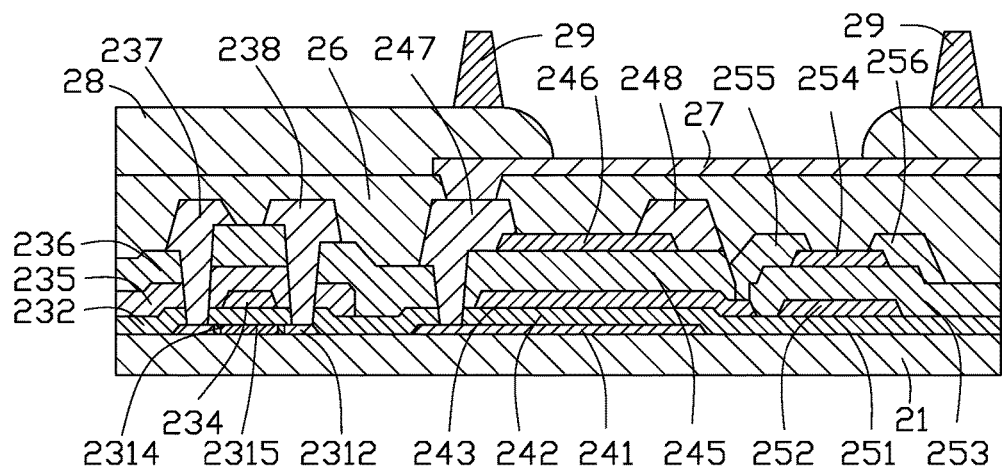

At block 113, as shown in FIG. 16, a light emitting defining layer 28 is formed on the planar layer 26 and partially covers the electrode layer 27 and a at least two spacers 29 spaced apart from each other are formed on the light emitting defining layer 28.

The embodiments shown and described above are only examples. Many details are often found in the art such as other features of a display device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:
1. An array substrate comprising:
   a substrate;

a first TFT formed on the substrate, the first TFT comprising a first channel layer formed on the substrate, a first gate insulator layer formed on the substrate and covering the first channel layer, a first gate electrode formed on the first gate insulator layer, a first dielectric layer formed on the first gate insulator layer and covering the first gate electrode, a second dielectric layer formed on the first dielectric layer, and a first source electrode and a first drain electrode formed on the second dielectric layer; the first source electrode and the first drain electrode electrically coupled to the first channel layer;

a second TFT formed on the substrate, the second TFT comprising a second gate insulator layer formed on the substrate, a second gate electrode formed on the second gate insulator layer, a third dielectric layer formed on the second gate insulator layer and covering the second gate electrode, a second channel layer formed on the third dielectric layer, and a second source electrode and a second drain electrode formed on the third dielectric layer; the second source electrode and the second drain electrode electrically coupled to the second channel layer; and a third TFT formed on the substrate, the third TFT comprising a third gate insulator layer formed on the substrate, a third gate electrode formed on the third gate insulator layer, a fourth dielectric layer formed on the second gate insulator layer and covering the third gate electrode, a third channel layer formed on the fourth dielectric layer, and a third source electrode and a third drain electrode formed on the fourth dielectric layer; the third source electrode and the third drain electrode electrically coupled to the third channel layer;

wherein the first channel layer is made of a semiconducting material containing polycrystalline silicon; the second channel layer and the third channel layer are made of a semiconducting material containing metal oxide; the third dielectric layer is positioned between the second gate electrode and the second channel layer, and is in direct contact with the second gate electrode and the second channel layer; the fourth dielectric layer is positioned between the third gate electrode and the third channel layer, and is in direct contact with the third gate electrode and the third channel layer; the first dielectric layer is made of silicon nitride; the second dielectric layer, the third dielectric layer, and the fourth dielectric layer are made of silicon oxide.

2. The array substrate of claim 1, wherein the first channel layer includes a non-doped portion, two first doped portions, and two second doped portions, wherein the non-doped portion is made of polycrystalline silicon; the two first doped portions and the two second doped portions are made of polycrystalline silicon doped with P-type ions or N-type ions; wherein the P-type ion is a kind of ion having a valence of positive three, and the N-type ion is a kind of ion having a valence of positive five; wherein the non-doped portion contains no doped ions, the two second doped portions is located at opposite sides of the non-doped portion, and wherein each first doped portion is located at a side of one second doped portion away from the non-doped portion, wherein each first doped portion has a doped ion concentration higher than that of each second doped portion.

3. The array substrate of claim 1, wherein a first hole and a second hole are defined in the second dielectric layer, the first hole and the second hole pass through the second dielectric layer, the first dielectric layer, and the first gate insulator layer, wherein the first source electrode extends into the first hole to electrically couple to the first channel layer, and the first drain electrode extends into the second hole to electrically couple to the first channel layer.

4. The array substrate of claim 3, wherein both the second source electrode and the second drain electrode are formed on the third dielectric layer partially cover the second channel layer to electrically couple to the second channel layer, and wherein both the third source electrode and the third drain electrode are formed on the fourth dielectric layer and partially cover the third channel layer to electrically couple to the third channel layer.

5. The array substrate of claim 4, wherein a third hole and a fourth hole are defined in the third dielectric layer, the third hole passes through the third dielectric layer and the second gate insulator layer, the second source electrode extends into the third hole to electrically couple to the first semiconductor layer, the fourth hole passes through the third dielectric layer, and the third source electrode extends into the fourth hole to electrically couple to the second gate electrode.

6. The array substrate of claim 1, wherein the first gate insulator layer, the second gate insulator layer, and the third gate insulator layer are formed by a single layer and are formed by a single process, and wherein the second dielectric layer, the third dielectric layer, and the fourth dielectric layer are formed by a single layer and are formed by a single process.

7. The array substrate of claim 1, wherein the array substrate further comprises a planar layer, an electrode layer, a light emitting defining layer, and at least two spacers, wherein the planar layer covers the first TFT, the second TFT, and the third TFT, and wherein the electrode layer is formed on the planar layer and passes through the planar layer to electrically couple to the second drain electrode, wherein the light emitting defining layer is formed on the planar layer and partially covers the electrode layer, and the at least two spacers are spaced apart from each other and positioned on the light emitting defining layer.

8. A display device comprising:

An array substrate, the array substrate comprising:
a substrate;
a first TFT formed on the substrate, the first TFT comprising a first channel layer formed on the substrate, a first gate insulator layer formed on the substrate and covering the first channel layer, a first gate electrode formed on the first gate insulator layer, a first dielectric layer formed on the first gate insulator layer and covering the first gate electrode, a second dielectric layer formed on the first dielectric layer; and a first source electrode and a first drain electrode formed on the second dielectric layer; the first source electrode and the first drain electrode electrically coupled to the first channel layer;

a second TFT formed on the substrate, the second TFT comprising a second gate insulator layer formed on the substrate, a second gate electrode formed on the second gate insulator layer, a third dielectric layer formed on the second gate insulator layer and covering the second gate electrode, a second channel layer formed on the third dielectric layer, and a second source electrode and a second drain electrode formed on the third dielectric layer; the second source electrode and the second drain electrode electrically coupled to the second channel layer; and a third TFT formed on the substrate, the third TFT comprising a third gate insulator layer formed on the substrate, a third gate electrode formed on the third gate insulator layer, a fourth dielectric layer formed on the second gate insulator layer and covering the third gate electrode, a third channel layer formed on the fourth dielectric layer, and a third source electrode and a third drain electrode formed on the fourth dielectric layer; the third source electrode and the third drain electrode electrically coupled to the third channel layer;

wherein the first channel layer is made of a semiconducting material containing polycrystalline silicon; the second channel layer and the third channel layer are made of a semiconducting material containing metal oxide; the third dielectric layer is positioned between the second gate electrode and the second channel layer, and is in direct contact with the second gate electrode and the second channel layer; the fourth dielectric layer is positioned between the third gate electrode and the third channel layer, and is in direct contact with the third gate electrode and the third channel layer; the first dielectric layer is made of silicon nitride; the second dielectric layer, the third dielectric layer, and the fourth dielectric layer are made of silicon oxide.

9. The display device of claim 8, wherein the first channel layer includes a non-doped portion, two first doped portions, and two second doped portions, wherein the non-doped portion is made of polycrystalline silicon; wherein the two first doped portions and the two second doped portions are made of polycrystalline silicon doped with P-type ions or N-type ions; wherein the P-type ion is a kind of ion having a valence of positive three, and the N-type ion is a kind of ion having a valence of positive five; wherein the non-doped portion contains no doped ions, the two second doped portions is located at opposite sides of the non-doped portion, and wherein each first doped portion is located at a side of one second doped portion away from the non-doped portion, wherein each first doped portion has a doped ion concentration higher than that of each second doped portion.

10. The display device of claim 8, wherein a first hole and a second hole are defined in the second dielectric layer, wherein the first hole and the second hole pass through the second dielectric layer, the first dielectric layer, and the first gate insulator layer, wherein the first source electrode extends into the first hole to electrically couple to the first channel layer, and the first drain electrode extends into the second hole to electrically couple to the first channel layer.

11. The display device of claim 10, wherein both the second source electrode and the second drain electrode are formed on the third dielectric layer and partially cover the second channel layer to electrically couple to the second channel layer, and wherein both the third source electrode and the third drain electrode are formed on the fourth dielectric layer and partially cover the third channel layer to electrically couple to the third channel layer.

12. The display device of claim 11, wherein a third hole and a fourth hole are defined in the third dielectric layer, the third hole passes through the third dielectric layer and the second gate insulator layer, the second source electrode extends into the third hole to electrically couple to the first semiconductor layer, the fourth hole passes through the third dielectric layer, and the third source electrode extends into the fourth hole to electrically couple to the second gate electrode.

13. The display device of claim 8, wherein the first gate insulator layer, the second gate insulator layer, and the third gate insulator layer are formed by a single layer and are formed by a single process, wherein the second dielectric layer, the third dielectric layer, and the fourth dielectric layer are formed by a single layer and are formed by a single process.

* * * * *